United States Patent [19]
Cooper et al.

[11] Patent Number: 5,962,384
[45] Date of Patent: Oct. 5, 1999

[54] METHOD FOR CLEANING SEMICONDUCTOR DEVICES

[75] Inventors: Emanuel I. Cooper, Bronx, N.Y.; Scott A. Estes; Glenn W. Gale, both of Essex Junction, Vt.; Rangarajan Jagannathan, South Burlington, Vt.; Harald F. Okorn-Schmidt, Putnam Valley; David L. Rath, Stormville, both of N.Y.

[73] Assignee: International Business Machines Corporation, Armonk, N.Y.

[21] Appl. No.: 08/959,038

[22] Filed: Oct. 28, 1997

[51] Int. Cl.[6] .............................. C11D 9/04; C11D 3/37; C03C 23/00; C23G 1/02
[52] U.S. Cl. .............................. 510/175; 510/480; 134/2; 134/3
[58] Field of Search .............................. 510/175, 480; 134/2, 3

[56] References Cited

U.S. PATENT DOCUMENTS

| | | |
|---|---|---|
| 5,290,361 | 3/1994 | Hayashida et al. . |
| 5,302,311 | 4/1994 | Sugihara et al. . |
| 5,478,436 | 12/1995 | Winebarger et al. . |

FOREIGN PATENT DOCUMENTS

| | | |
|---|---|---|
| 0 528 053 A1 | 2/1993 | European Pat. Off. . |
| 0 560 324 A1 | 9/1993 | European Pat. Off. . |
| 3822350 | 1/1990 | Germany . |
| WO 92/16017 | 9/1992 | Japan . |

OTHER PUBLICATIONS

J. Electrochem. Soc., "Thin–Oxide Dielectric Strength Improvement by Adding a Phosphonic Acid Chelating Agent into $NH_4OH–H_2O_2$ Solution", vol. 141, No. 10, Oct. 1994, pp. L139–L142.

Hideo Akiya et al, J. Electrochem. Soc., "Thin–Oxide Dielectric Strength Improvement . . . ", vol. 141, No. 10, Oct. 1994, pp. L139–L142, ACS Abstract.

*Primary Examiner*—Yogendra Gupta
*Assistant Examiner*—John M Petruncio
*Attorney, Agent, or Firm*—Delio & Peterson, LLC; John J. Tomaszewski; Howard J. Walter, Jr.

[57] ABSTRACT

A method is provided for treating a plurality of semiconductor substrates using the same aqueous SC-1 solution which solution removes and/or inhibits contamination of the semiconductor surfaces by metallic ions present in the solution or on the substrate surface comprising a basic solution containing hydrogen peroxide and an oxidation-resistant chelating additive such as CDTA in an amount effective to provide the desired treatment results. The SC-1 solution may be the conventional 5:1:1 (water:$NH_4OH$:$H_2O_2$) solution or a dilute solution such as a 5:x:1 to 200:x:1 solution wherein x is 0.025 to 2.

9 Claims, No Drawings

METHOD FOR CLEANING SEMICONDUCTOR DEVICES

BACKGROUND OF THE INVENTION

1. Field of the Invention

This invention relates generally to cleaning (treating) semiconductor substrate surfaces during the electronic component fabrication process and, in particular, to a method for cleaning the substrate surfaces during a fabrication process in which a plurality of substrates are cleaned using basic aqueous solutions of hydrogen peroxide containing specially defined complexing agents which solutions remove organic and particulate matter from the substrate surfaces and/or inhibit metal contamination of the substrate surface from the cleaning solution during the fabrication process.

2. Description of Related Art

In semiconductor cleaning technology, basic aqueous solutions of hydrogen peroxide are primarily used to contact and clean semiconductors to remove organic and particulate matter from the substrate surface. Metallic contaminants and/or organic particulate matter on the substrate surface are a problem and the well-known RCA-cleaning method is typically used for treating the semiconductor surface. In general, the RCA-cleaning method is a two-step wet cleaning cycle in which, in the first step, a basic aqueous solution of hydrogen peroxide (generally called SC-1 solution) is used to remove particles and organic contamination on the semiconductor surface. In the second step, a mixture of HCl, $H_2O_2$ and $H_2O$ (generally called SC-2) is used to remove metallic contaminants from the semiconductor surface.

One of the major drawbacks of the SC-1 type solutions is the contamination of the semiconductor surface with metallic ions and precipitates by adsorption and/or ion-exchange mechanisms during continuous use of the solution over a period of time in which a number of semiconductor substrates are cleaned in the same cleaning bath. This metal contamination has been shown to be responsible for certain defect formation mechanisms in subsequent device manufacturing steps. The metal contamination occurs as a result of metal ions in the SC-1 cleaning solution. The sources of the contaminating ions are impurities in the process chemicals and/or the treated wafers. Another critical problem, especially when a hydrophobic silicon surface is immersed in such a mixture, is the possibility of surface roughening by micro-masking by oxygen bubbles generated through peroxide decomposition and through localized corrosion (triggered by adsorbed metallic ions or precipitates).

To remove this metallic contamination from the surface before the next processing step, the additional acid cleaning step using the SC-2 cleaning solution is performed. This removes the metallic contamination efficiently, however, re-contamination with particles often occurs. In order to avoid these problems, it is desirable to eliminate the SC-2 acid cleaning step for a variety of reasons including cost, equipment size and cycle time reduction. To eliminate the SC-2 step, it is necessary, however, to reduce or inactivate the metal contaminants in the SC-1 cleaning step to below a specified maximum allowable activity level.

Complexing or chelating agents are known to have been added to the basic SC-1 cleaning solution to reduce the residual metal contamination on the semiconductor surface after the cleaning step. This has been shown in a number of patents including U.S. Pat. Nos. 5,290,361 and 5,302,311; European Patent Nos. 92906248.7 and 93103841.8; Japanese Patent No. PCT/JP92/00219 and German Patent No. DE3822350A1. In U.S. Pat. No. 5,290,361, a phosphonic acid complexing agent is employed in the SC-1 solution to lower or inhibit the metallic impurities left on the semiconductor surface. The patent discloses the use of a number of other chelating agents such as ethylenediamine tetraacetic acid (EDTA); 1,2-cyclohexanediaminetetraacetic acid (CDTA); triethylenetetraminehexaacetic acid (TTHA); and nitrilotriacetic acid (NTA) as not being as effective as the phosphonic acid complexants of the patent. This is also demonstrated in the article "Thin-Oxide Dielectric Strength Improvement by Adding a Phosphonic Acid Chelating Agent into $NH_4OH$—$H_2O_2$ Solution" by Akiya et al., J. Electrochem. Soc., Vol. 141, No. 10, October 1994, pp. L139–L142.

The above references, however, do not address the major concern of a fabrication process which is the need for a cleaning solution which maintains its cleaning activity over a period of time during which a large number of semiconductor substrates are cleaned using the same bath. For example, in the aforementioned U.S. Pat. No. 5,290,361, known aminoacetic acid chelating agents are stated to be ineffective in SC-1 cleaning solutions when compared to the claimed phosphonic acid additives. The cleaning tests performed were concerned, however, only with a single cleaning experiment and did not address the more important problem of both bath stability and bath effectiveness over time.

Bearing in mind the problems and deficiencies of the prior art, it is therefore an object of the present invention to provide stable cleaning solutions for cleaning a plurality of semiconductor substrates with the same solution which solutions clean the surface while removing from and/or inhibiting metallic contamination of the semiconductor surface.

It is a further object of the present invention to provide a method for treating semiconductor substrate surfaces with cleaning solutions, in particular, SC-1 type solutions, which solutions remove from and/or inhibit metallic contamination of the semiconductor surface during the cleaning process in which a plurality of semiconductors are cleaned using the same solution or a replenished solution, and, further, which solutions are stable over extended use periods.

Another object of the present invention is to make the wafer cleaning process more robust in relation to accidental metal ion contamination of the solution and/or the cleaning equipment containing the solution since the presence of the complexant prevents wafer contamination and lower yields. Contaminated cleaning equipment can also be cleaned without being taken off line by using the cleaning solution of the invention.

Still other objects and advantages of the invention will be readily apparent from the following description.

SUMMARY OF THE INVENTION

The above and other objects and advantages, which will be apparent to one of skill in the art, are achieved in the present invention which is directed, in a first aspect, to an aqueous solution for treating a plurality of semiconductor substrate surfaces comprising an organic or inorganic base, hydrogen peroxide and 1,2-cyclohexanediaminetetraacetic acid (CDTA) as an additive in an amount greater than about 1 ppb to 1,000 ppm to minimize and/or inhibit contamination of the semiconductor surface by metallic ions present in the treating solution or on the semiconductor substrate surface. In a preferred aspect, the CDTA is present in an amount of about 10–100 ppm. The pH of the cleaning solution is about 9–11.

In another aspect of the invention, an aqueous solution is provided for treating semiconductor substrate surfaces comprising an organic or inorganic base and hydrogen peroxide. In the case of ammonium hydroxide as base, the volume ratio of water:base (ammonium hydroxide):H2O2 is greater than about 5:x:1 to about 200:x:1 wherein x is about 0.05 to 2 and the solution further contains CDTA in an amount of about 1 ppb to 1,000 ppm. With regard to the base material, ammonium hydroxide is the typical base of choice and is generally used in a 25–30% by weight aqueous solution ($NH_4OH$). Likewise, hydrogen peroxide is typically used in the form of a 28–32% by weight aqueous solution. Accordingly, therefore, when a volume ratio such as 5:1:1 is specified as the treating solution, this will refer hereinafter to the use of the aqueous solutions of ammonium hydroxide and hydrogen peroxide and not to the pure forms of each material. It will then be understood that, for example, a 5:1:1 volume ratio is, in effect, a more dilute solution with regard to the amount of base and peroxide actually in the solution relative to the water.

In a preferred treating solution, the volume ratio of the components is about 10:1:1 to about 40:1:1. In highly preferred cleaning solutions, the CDTA is above about 1 ppm to about 100 ppm and most preferably about 10 ppm. The CDTA is readily soluble in basic solutions but not in water and the CDTA can be added to the cleaning solution in solid form or, preferably, as a solution in the base used in the cleaning solution, preferably ammonium hydroxide.

In a further aspect of the invention, a method is provided for treating a plurality of semiconductor substrate surfaces with the same cleaning solution or a replenished solution to clean the surfaces while removing from and/or inhibiting metallic contamination of the treated surface. The steps comprise contacting a plurality of the semiconductor substrate surfaces with an aqueous solution comprising an organic or inorganic base, hydrogen peroxide and CDTA in an amount greater than about 1 ppb to about 1,000 ppm. Typically, a number of batches of semiconductor substrates are cleaned using the same treating solution or replenished solution, and it is an important feature of the invention that the cleaning solution is stable over time and during use of the solution to treat a number of batches of substrates. Each batch typically contains about twenty-five wafers. It has been found that there is a lower metallic contamination on the substrates when using the cleaning solutions of the invention during a typical fabrication process, compared to a SC-1 solution without complexant.

In an additional aspect of the invention, the above method is highly preferred for use with dilute cleaning solutions having a water:ammonium hydroxide:peroxide volume ratio of greater than about 5:1:1, preferably about 40:1:1.

In a further aspect of the invention, a blend of two or more complexants of the invention is provided to provide enhanced SC-1 cleaning. Exemplary is the use of CDTA in combination with other aminoacetic acids such as DTPA (diethylenetriaminepentaacetic acid). It has been found that the CDTA has higher complex stability constants for calcium, iron, copper, manganese, and most other light metals. DTPA has higher stability constants for lanthanides, actinides, and several other heavy metals (Hg, Tl, Bi). When the latter group is of concern, the use of CDTA and DTPA in combination provides an enhanced cleaning solution. Since DTPA is not as stable as CDTA against oxidative decomposition, continuous or periodic replenishment with a DTPA solution is necessary for the extended use of this modified SC-1 solution.

In an additional aspect of the invention, aminoacetic-based complexants are provided for use in the solutions and method of the invention which have improved resistance to oxidative degradation and enhanced bath stability for cleaning a plurality of semiconductor substrates. Broadly stated, the compounds comprise aminoacetic compounds in which any nitrogen atom is separated from its nearest nitrogen neighbor by 1–4 carbon atoms, and in which one or both of the following conditions exist: (a) carbons in the beta position relative to nitrogen carry no hydrogen atoms (e.g., 2, 2-dimethyl-1,3-diaminopropane-N,N,N',N'-tetraacetic acid (DMDPTA) and methylenediamine-N,N,N',N'-tetraacetic acid (MDTA)) or carry only hydrogens which are anticlinal or antiperiplanar to said nitrogen (e.g., cis, cis, cis-3,5-dimethyl-1,2-diaminocyclopentane-N,N,N',N'-tetraacetic acid), and (b) the compound is polycyclic and any hydrogens in a synclinal or synperiplanar conformational relationship with an amino nitrogen are in bridgehead positions (e.g., cis-bicyclo (2.2.2) octane-2,3-diamine-N,N,N', N'-tetraacetic acid (CBODTA)).

DESCRIPTION OF THE PREFERRED EMBODIMENT(S)

The semiconductor surface treating solution of the present invention comprises an aqueous solution which is alkaline and which contains hydrogen peroxide. The treating solution contains an additive which removes and/or inhibits contamination of a plurality of semiconductor surfaces being treated during the fabrication process by metallic ions present in the solution or on the semiconductor surface. Typically, the solution is used until it is no longer useful to clean the surface and a solution is generally used for about 4–8 hours of actual cleaning. Make-up $NH_4OH$ or other base and/or additive may be added during the process to form a replenished solution. $H_2O_2$ may also be replenished if necessary.

In general, the basic aqueous solution for treating the semiconductor surface is termed SC-1 and contains an organic or inorganic base, hydrogen peroxide and water. In conventional treating solutions, the volume ratio of water:base:peroxide is about 5:1:1 by volume.

With regard to the base material of the composition, a variety of organic or inorganic bases may be used. Exemplary are ammonium hydroxide, tetramethylammonium hydroxide or choline (2-hyroxyethyltrimethylammonium hydroxide) and the like. Hydrogen peroxide is the preferred oxidant and, as noted above, is preferably used in the form of a 28–32%, by weight, aqueous solution.

With regard to the treating solution, the volume ratio of water:ammonium hydroxide:peroxide is conventionally about 5:1:1. It is an important aspect of the invention that dilute solutions of the aqueous cleaning solution can be used with ratios up to 200:x:1 and above wherein x is about 0.05 to 2. These solutions have been found to provide enhanced operating benefits when used with the complexants of the invention to remove and/or inhibit metallic contamination of the semiconductor substrates being treated.

With regard to the conventional treating solutions having a $H_2O:NH_4OH:H_2O_2$ volume ratio of about 5:1:1, it has been found that the use of CDTA as an additive in an amount greater than 1 ppm inhibits contamination of the semiconductor surface by metallic ions present in the solution or on the substrate surface. Previous disclosures regarding the use of CDTA, for example, in U.S. Pat. No. 5,290,361, show the use of CDTA in an amount of 1 ppm and discloses that this amount was relatively ineffective when compared to the phosphonic acid chelaters of the patent. The CDTA was also compared with EDTA, TTHA and NTA and all were considered to be ineffective. It has been found that amounts of CDTA greater than 1 ppm, preferably 10–100 ppm are effective in such 5:1:1 solutions and that the solutions have enhanced stability when treating a plurality of semiconductor substrates in a typical fabrication process.

It is a further important aspect of the invention that the cleaning effectiveness and stability of dilute SC-1 cleaning solutions containing greater than 5:x:1 volume ratio of components to about 200:x:1 and above may be enhanced by addition of about 1 ppm to 1,000 ppm of the CDTA additive preferably 10 ppm to 100 ppm. Likewise, these dilute solutions have enhanced stability and provide effective chelating results for removing and/or inhibiting contamination of the semiconductor surface by metallic ions present in the cleaning solution or on the substrate surface.

The CDTA used in the invention is preferably the trans isomer. The cis isomer may also be used, but is less preferred as is a mixture of the trans and cis isomers. The trans isomer is commercially available and it is contemplated herein that a cis/trans isomer mixture may be prepared using the same or similar synthesis techniques as used to make a pure trans isomer or a pure cis isomer. It will be apparent to those skilled in the art that a variety of substituents can be on the cyclohexane ring of CDTA without impairment or even with some improvement of the effectiveness of the complexant. In particular, alkyl substituents (e.g., C1–C4) in the 1, 2, 5 and/or 6 ring position(s) further stabilize the complexant against oxidative decomposition and enhance the bath stability and effectiveness.

It is also contemplated in the invention that the CTDA can be used in combination with other chelating agents such as EDTMP to provide enhanced synergistic treatment results. Other exemplary complexants which may be used with CTDA include nitrilotris (methylene) triphosphonic acid (NTMP).

It is another important feature of the invention that oxidation resistant aminoacetic complexants may be used either alone or in combination with the CTDA to provide an enhanced stable SC-1 cleaning solution. These aminoacetic based complexants are generally defined as having carbons at beta positions relative to nitrogen atoms which carbon atoms carry no hydrogen atoms or carry only hydrogens which are anticlinal or antiperiplanar to said nitrogens. One class of complexants has improved resistance to oxidative degradation by the cleaning solution and provides enhanced stability when treating a plurality of semiconductor substrates and other operating effects. Three examples of such aminoacetic compounds are (DMDPTA) 2,2-dimethyl-1,3-diaminopropane-N,N,N',N'-tetraacetic acid and (MDTA) methylenediamine-N,N,N',N'- tetraacetic acid and cis, cis, cis-3,5-dimethyl-1,2-diaminocyclopentane-N,N,N',N'-tetraacetic acid. An additional class of such oxidation-resistant aminoacetic compounds includes polycyclic compounds in which any hydrogens in a synclinal or synperiplanar conformational relationship with an amino nitrogen are in bridgehead positions. A typical example of this type of aminoacetic compound is cis-bicyclo (2.2.2) octane-2,3-diamine-N,N,N',N'-tetraacetic acid (CBODTA).

The SC-1 cleaning solutions are generally used at elevated temperatures of about 65–75° C. for about 5–20 minutes, typically 10 minutes for each batch of wafer cleaned. Usually 25–50 wafers are treated per batch in a bath and mixing of the batch is generally by recirculation of the bath solution.

The present invention is illustrated by the following examples. In the examples, the composition of the treating solution will be referred to as a volume ratio of water:base:p- eroxide which individual components are made using commercial solutions such as a 25–30% ammonium hydroxide and 28–32% hydrogen peroxide. Unless otherwise specified, all other percents, ppm and ppb are by weight.

EXAMPLE 1

The stability of complexants in an SC-1 treatment solution was tested by their effectiveness at suppressing $H_2O_2$ decomposition by measuring the concentration of hydrogen peroxide remaining in a heated (65° C.) 20:0.5:1 SC-1 solution after 10 hours. The SC-1 solutions were pre-contaminated with Al, Ca, Co, Cu, Fe, Mn, Ni, Ti and Zn all with concentrations about 1 ppb. The initial concentration of peroxide was 0.44 M.

TABLE 1

| RUN | COMPLEXANT (PPM) | $H_2O_2$ (M) | % $H_2O_2$ REMAINING |
|---|---|---|---|
| 1 | CDTA (20) | 0.48 | 109 |
| 2 | CDTA (10) | 0.47 | 107 |
| A | NONE | 0.09 | 20 |
| B | EDTMP (20) | 0.39 | 89 |
| C | EDTMP (25) | 0.40 | 91 |
| D | EDTA (20) | 0.10 | 23 |
| E | EDTA (17) | 0.10 | 23 |

The reason for a higher hydrogen peroxide concentration in Runs 1 and 2 compared to the initial concentration, is due to evaporation of the other solution components such as water and ammonia. All the other runs would otherwise be comparative. EDTMP is ethylenediamine tetra (methylenephosphonic) acid and EDTA is ethylenediaminetetraacetic acid.

EXAMPLE 2

The stability of the CDTA complexant in an 20:0.5:1 solution containing 9.3 ppm CDTA in which a silicon wafer was immersed was determined by maintaining the solution at a temperature of about 63° C. and measuring the CDTA concentration by ion chromatography. The results are shown below:

TABLE 2

| TIME (HOURS) | CDTA (PPM) | % CDTA LOSS |
|---|---|---|
| 0 | 9.2 ± .3 | — |
| 1 | 8.7 ± .2 | 5.4 |
| 2 | 8.4 ± .3 | 8.7 |
| 3 | 7.9 ± 0.05 | 14.1 |
| 4 | 7.6 ± 0.02 | 17.4 |

From the above results, it can be seen that CDTA is substantially stable in the SC-1 solution over a period of 4 hours during treatment of a silicon wafer. This is important for process control where time can be used to determine when the SC-1 solutions should be replaced or replenished.

EXAMPLE 3

Example 2 was repeated except that the solution temperature was 65° C., and $Cu^{+2}$ and $Fe^{+3}$ ions were added as indicated to determine their effect on the stability of CDTA. The results are as follows:

| COMPOSITION | % CDTA LOSS/HOUR |
| --- | --- |
| No added metal ions | 4.55 |
| 10 ppb $Cu^{+2}$ | 5.35 |
| 10 ppb $Fe^{+3}$ | 6.04 |

The results indicate only a minor effect of the metal ions on the stability of the CDTA. This effect is normally insignificant under regular process conditions, where $Cu^{+2}$ and $Fe^{+3}$ concentrations are much lower than 10 ppb.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for treating a plurality of batches of semiconductor substrate surfaces with the same cleaning solution to clean the surfaces while removing and/or inhibiting metallic contamination of the treated surface with the method comprising contacting a plurality of batches of the semiconductor substrate surfaces with an aqueous solution comprising an organic or inorganic base, hydrogen peroxide and 1,2-cyclohexane diaminetetraacetic acid in an amount greater than about 1 ppb to about 1,000 ppm.

2. The method of claim 1 wherein the 1,2-cyclohexane diaminetetraacetic acid is in an amount of about 10 ppm to 100 ppm.

3. The method of claim 1 wherein the 1,2-cyclohexane diaminetetraacetic acid is in the trans isomer form.

4. The method of claim 1 wherein the solution has a water:base:peroxide volume ratio of about 5:x:1 to 200:x:1 wherein x is about 0.025 to 2.

5. The method of claim 1 wherein the solution is replenished during use.

6. The method of claim 1 wherein 1,2-cyclohexane diamindetraacetic acid is added in the form of a solution in ammonium hydroxide.

7. An aqueous solution for treating a plurality of batches of semiconductor substrate surfaces comprising an organic or inorganic base, hydrogen peroxide and 1,2-cyclohexanediaminetetraacetic acid as an additive in an amount greater than 1 ppm to 1,000 ppm to remove and/or inhibit contamination of the semiconductor surface by metallic ions present in the treating solution or on the semiconductor substrate surface.

8. The aqueous solution of claim 7 wherein the CDTA is in an amount of about 10 ppm to 100 ppm.

9. The aqueous solution of claim 7 wherein the solution has a water:ammonium hydroxide:peroxide volume ratio of about 5:x:1 to 200:x:1 wherein x is 0.025 to 2.

* * * * *

UNITED STATES PATENT AND TRADEMARK OFFICE
CERTIFICATE OF CORRECTION

PATENT NO. : 5,962,384
DATED : October 5, 1999
INVENTOR(S) : Emanuel I. Cooper et al.

It is certified that error appears in the above-identified patent and that said Letters Patent is hereby corrected as shown below:

In the Claims

In claim 1, column 7, line 30, after "1" delete "ppb" and substitute therefor -- ppm --.

Signed and Sealed this

Eighteenth Day of April, 2000

Attest:

Q. TODD DICKINSON

Attesting Officer          Director of Patents and Trademarks